(12) United States Patent
Hsieh et al.

(10) Patent No.: US 10,670,630 B2
(45) Date of Patent: Jun. 2, 2020

(54) PROBE CARD DEVICE AND RECTANGULAR PROBE

(71) Applicant: CHUNGHWA PRECISION TEST TECH. CO., LTD., Taoyuan (TW)

(72) Inventors: Chih-Peng Hsieh, Taipei (TW); Yen-Chen Chen, Taipei (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 123 days.

(21) Appl. No.: 15/926,686

(22) Filed: Mar. 20, 2018

(65) Prior Publication Data

US 2019/0227101 A1 Jul. 25, 2019

(30) Foreign Application Priority Data

Jan. 24, 2018 (TW) .............................. 107102526 A

(51) Int. Cl.
*G01R 1/073* (2006.01)
*G01R 31/26* (2020.01)

(52) U.S. Cl.
CPC ....... *G01R 1/07307* (2013.01); *G01R 1/0735* (2013.01); *G01R 1/07314* (2013.01); *G01R 1/07371* (2013.01); *G01R 31/2601* (2013.01)

(58) Field of Classification Search
CPC .............. G01R 1/06716; G01R 1/0675; G01R 1/06755; G01R 1/06761; G01R 1/07307; G01R 1/07314; G01R 1/07328; G01R 1/0735; G01R 31/2601
USPC ............. 324/755.01, 755.11, 756.03, 756.04
See application file for complete search history.

(56) References Cited

U.S. PATENT DOCUMENTS

| | | | | |
|---|---|---|---|---|
| 4,730,159 A * | 3/1988 | Collins | .............. | G01R 1/07392 324/754.14 |
| 5,210,485 A * | 5/1993 | Kreiger | .............. | G01R 1/07314 29/846 |
| 2009/0096474 A1* | 4/2009 | Rogers | .................. | G01R 1/0735 324/750.19 |
| 2012/0319711 A1* | 12/2012 | Hung | .................. | G01R 1/07371 324/750.16 |
| 2013/0203298 A1* | 8/2013 | Zhou | .................. | G01R 1/06722 439/700 |
| 2013/0265074 A1* | 10/2013 | Sato | .................... | G01R 1/07357 324/755.01 |
| 2014/0210505 A1* | 7/2014 | Chen | .................... | G01R 1/0735 324/756.03 |

(Continued)

*Primary Examiner* — Steven L Yeninas
(74) *Attorney, Agent, or Firm* — Li & Cai Intellectual Property (USA) Office

(57) ABSTRACT

A probe card device and a rectangular probe are provided. The rectangular probe includes a metallic pin, an insulating film, and an insulating latch. The metallic pin includes a connecting portion, a detecting portion, and a middle segment arranged between the connecting portion and the detecting portion. The insulating film covers entirely outer surfaces of the middle segment. The insulating latch is in a ring shape and is arranged around at least part of the insulating film. A bottom of the insulating latch is arranged adjacent to the detecting portion. A length of the insulating latch is less than or equal to that of the insulating film, and a thickness of the insulating latch is larger than that of the insulating film and is at least 10 μm.

9 Claims, 8 Drawing Sheets

(56) References Cited

U.S. PATENT DOCUMENTS

2017/0299634 A1* 10/2017 Crippa ............... G01R 1/06761
2018/0088150 A1* 3/2018 Kuga ................. G01R 1/07371

\* cited by examiner

PROBE CARD DEVICE AND RECTANGULAR PROBE

BACKGROUND OF THE INVENTION

1. Field of the Invention

The present disclosure relates to a probe card; in particular, to a probe card device and a rectangular probe.

2. Description of Related Art

In a testing process of semi-conductor wafer, a testing apparatus is electrically connected to an object to be tested by using a probe card device, and the testing apparatus can obtain a testing result of the object to be tested by signal transmission and signal analysis. The conventional probe card device has a plurality of probes corresponding in position to electrical pads of the object, and the probes are used to simultaneously and respectively contact with the electrical pads of the object.

Specifically, the probes of the conventional probe card device can be rectangular probes, which can be made by using a microelectromechanical systems (MEMS) technology to form a determined shape according to design requirements. However, the conventional rectangular probe is made of a single material, so that the conventional rectangular probe cannot be formed with a better current conduction property and a better mechanical strength property at the same time. Moreover, when the rectangular probes are installed to the conventional probe card device or are used to test an object to be tested, some drawbacks (e.g., a collision, a great friction, or a poor fixation) easily occur between the rectangular probes and a probe head of the conventional probe card device.

SUMMARY OF THE INVENTION

The present disclosure provides a probe card device and a rectangular probe to effectively improve the drawbacks associated with conventional rectangular probes (or the conventional probe card devices).

The present disclosure provides a probe card device, which includes an upper die, a lower die, and a plurality of rectangular probes. The upper die has a plurality of first thru-holes, and each of the first thru-holes has a first aperture. The lower die has a plurality of second thru-holes. The second thru-holes respectively correspond in position to the first thru-holes, and each of the second thru-holes has a second aperture smaller than the first aperture. The rectangular probes each have a first end and a second end opposite to the first end. The first ends of the rectangular probes are respectively arranged adjacent to and outside of the first thru-holes, and the second ends of the rectangular probes respectively pass through the second thru-holes. Each of the rectangular probes includes a metallic pin, an insulating film, and an insulating latch. The metallic pin includes a connecting portion, a detecting portion, and a middle segment arranged between the connecting portion and the detecting portion. The connecting portion is arranged adjacent to and outside of the corresponding first thru-hole, the detecting portion passes through the corresponding second thru-hole, and the middle segment is arranged between the upper die and the lower die. The insulating film covers entirely outer surfaces of the middle segment. The insulating latch is in a ring shape and is arranged around at least part of the insulating film. A length of the insulating latch is less than or equal to that of the insulating film, and a thickness of the insulating latch is larger than that of the insulating film and is at least 10 µm. The insulating latch passes through the corresponding first thru-hole, and a bottom of the insulating latch is arranged adjacent to the detecting portion and the corresponding second thru-hole. When the insulating latch is orthogonally projecting onto the lower die to form a ring-shaped projected region, an edge of the corresponding second thru-hole is arranged between an inner edge and an outer edge of the ring-shaped projected region.

The present disclosure also provides a rectangular probe, which includes a metallic pin, an insulating film, and an insulating latch. The metallic pin includes a connecting portion, a detecting portion, and a middle segment arranged between the connecting portion and the detecting portion. The insulating film covers entirely outer surfaces of the middle segment. The insulating latch is in a ring shape and is arranged around at least part of the insulating film. A bottom of the insulating latch is arranged adjacent to the detecting portion, a length of the insulating latch is less than or equal to that of the insulating film, and a thickness of the insulating latch is larger than that of the insulating film and is at least 10 µm.

In summary, because of the structural design and arrangement of the metallic pin, the insulating film, and the insulating latch of the rectangular probe (or the probe card device) in the present disclosure, the structural strength of the metallic pin can be effectively improved without affecting the electrically conductive property of the metallic pin, the metallic pin is capable of providing a better buffering performance so as to effectively mitigate collision and friction of the metallic pin with respect to the upper die and the lower die, and the rectangular probe can be firmly installed to the upper die and the lower die.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 7, which illustrate an embodiment of the present disclosure. References are hereunder made to the detailed descriptions and appended drawings in connection with the present disclosure. However, the appended drawings are merely provided for exemplary purposes, and should not be construed as restricting the scope of the present disclosure.

Figure 1:
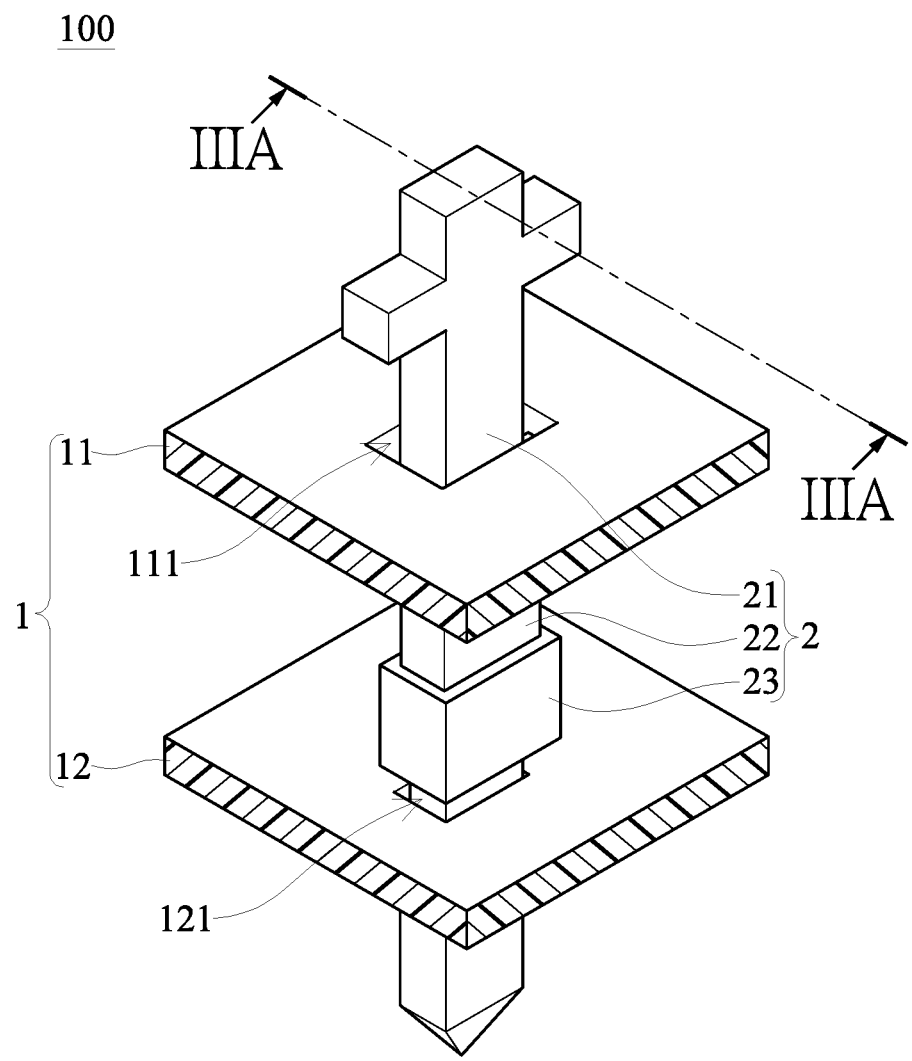
FIG. 1 is a perspective view showing a probe card device according to the present disclosure.
Figure 2:
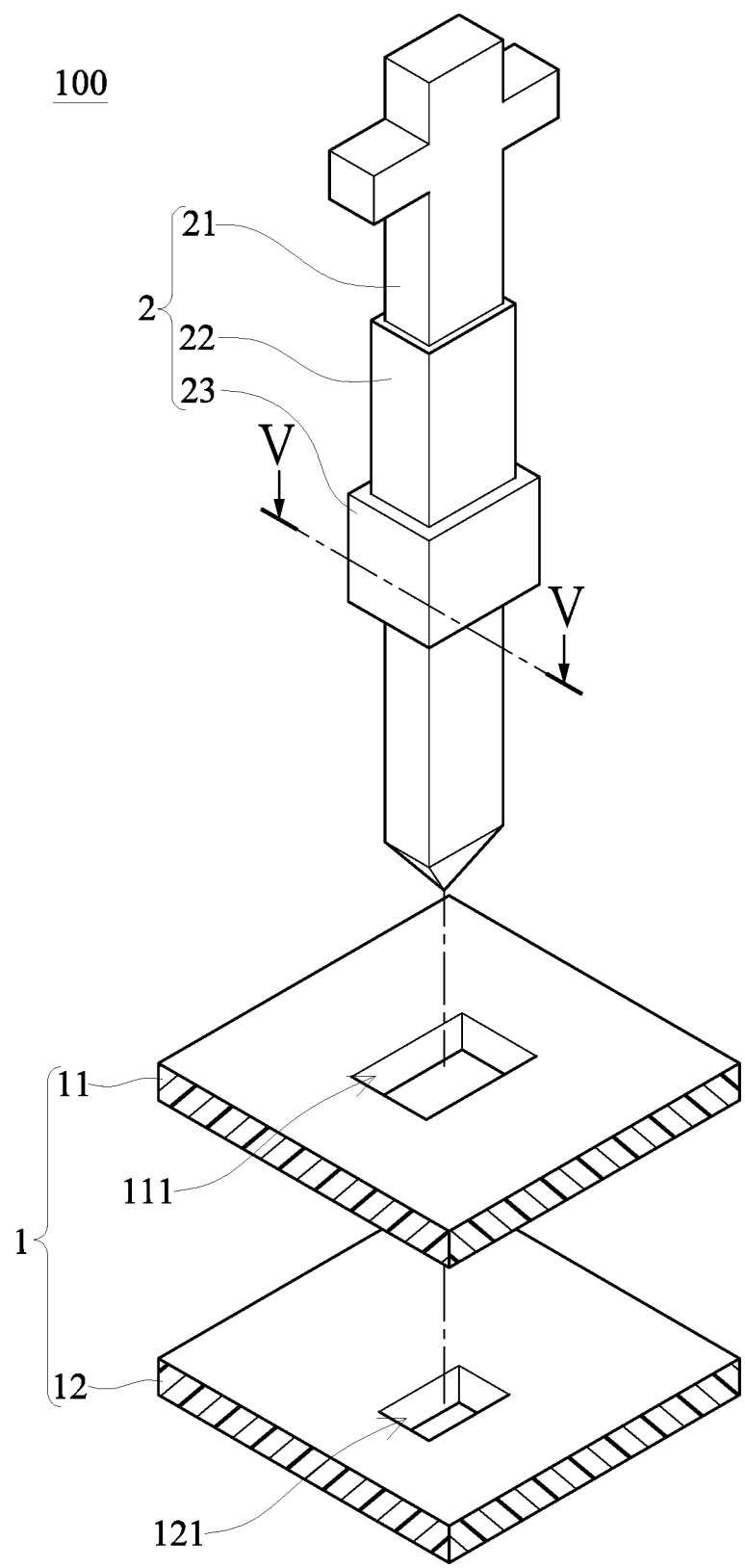
FIG. 2 is an exploded view of FIG. 1.

As shown in FIGS. 1 and 2, the present embodiment discloses a probe card device 100. The probe card device 100 includes a probe head 1 and a plurality of rectangular probes 2 inserted into the probe head 1. Each of the rectangular probes 2 has a first end and a second end opposite to the first end. The first ends of the rectangular probes 2 respectively contact with a plurality of electrical pads of a space transformer (not shown), and the second ends of the rectangular probes 2 can be used for testing an object to be tested, such as a semi-conductor wafer (not shown).

In order to easily express the present embodiment, the figures only show a part of the probe card device 100 for clearly showing the structure and connection of each component of the probe card device 100. The following description discloses the structure and connection of each component of the probe card device 100.

Referring to FIGS. 1 and 2, the probe head 1 includes an upper die 11, a lower die 12, and a spacer (not shown) sandwiched between the upper die 11 and the lower die 12. The upper die 11 has a plurality of first thru-holes 111 each having a first aperture, and the lower die 12 has a plurality of second thru-holes 121 each having a second aperture smaller than the first aperture. The upper die 11 is substantially parallel to the lower die 12, and the second thru-holes 121 respectively correspond in position to the first thru-holes 111.

The rectangular probes 2 are substantially in a matrix arrangement, the first ends of the rectangular probes 2 are respectively arranged adjacent to and outside of the first thru-holes 111 of the upper side 11, and the second ends of the rectangular probes 2 respectively pass through the second thru-holes 121 of the lower die 12. In other words, each of the rectangular probes 2 sequentially passes through the corresponding first thru-hole 111 of the upper die 11, the spacer, and the corresponding second thru-hole 121 of the lower die 12. The present embodiment does not disclose the detailed structure of the spacer.

Specifically, the rectangular probe 2 in the present embodiment is cooperated with the probe head 1 including the upper die 11, the spacer, and the lower die 12, but the practical application of the rectangular probe 2 is not limited thereto. In other words, the rectangular probe 2 can be sold individually or can be applied to other devices. Moreover, as the rectangular probes 2 are of the same structure, the following description only discloses the structure of one of the rectangular probes 2 for the sake of brevity. However, in other embodiments of the present disclosure, the rectangular probes 2 of the probe card device 100 can be formed with different structures.

It should be noted that the probe card device 100 in the present embodiment is limited to the use of the rectangular probe 2 (the rectangular probe 2 can be made by using MEMS technology), so that the present embodiment excludes any round probe (the round probe is made of a producing process differing from the MEMS technology). In other words, since the producing process of the rectangular probe 2 is drastically different from that of any round probe, the round probe does not provide any motivation for the production of the rectangular probe 2.

Figure 5:
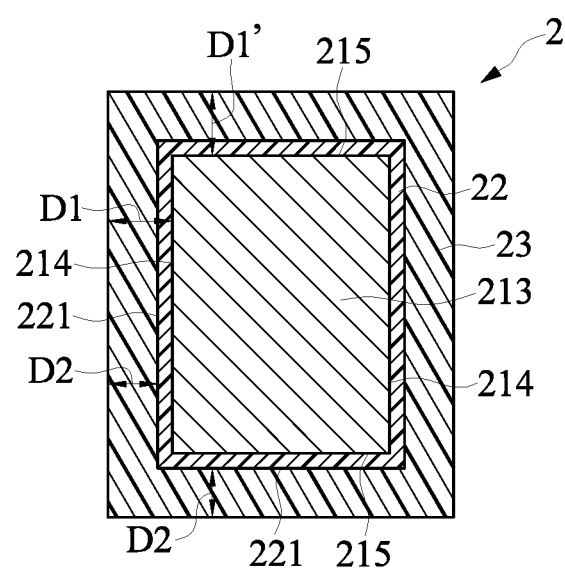
FIG. 5 is a cross-sectional view taken along a cross-sectional line V-V of FIG. 2.

The rectangular probe 2 in the present embodiment is electrically conductive, and the rectangular probe 2 has a flexible straight structure. The rectangular probe 2 has a cross section perpendicular to a longitudinal direction thereof, and the cross section is a substantial rectangle (as shown in FIG. 5). The rectangular probe 2 includes a metallic pin 21, an insulating film 22 covering outer surfaces of the metallic pin 21, and an insulating latch 23 arranged around outer surfaces 221 (as shown in FIG. 5) of the insulating film 22. The material of the metallic pin 21 can be Au, Ag, Cu, Ni, Co, or an alloy mixed with at least two of them, and the material of the insulating film 22 or the insulating latch 23 can be a poly-p-xylene, a polytetrafluoroethylene, or an epoxy, but the present disclosure is not limited thereto. In the present embodiment, the insulating film 22 and the insulating latch 23 are preferably made by the same insulative material, and are integrally formed as a one-piece structure in one producing process. However, in other embodiments of the present disclosure, the insulating film 22 and the insulating latch 23 can be made by different insulative materials, and are independently formed in two different producing processes.

Figure 3A:
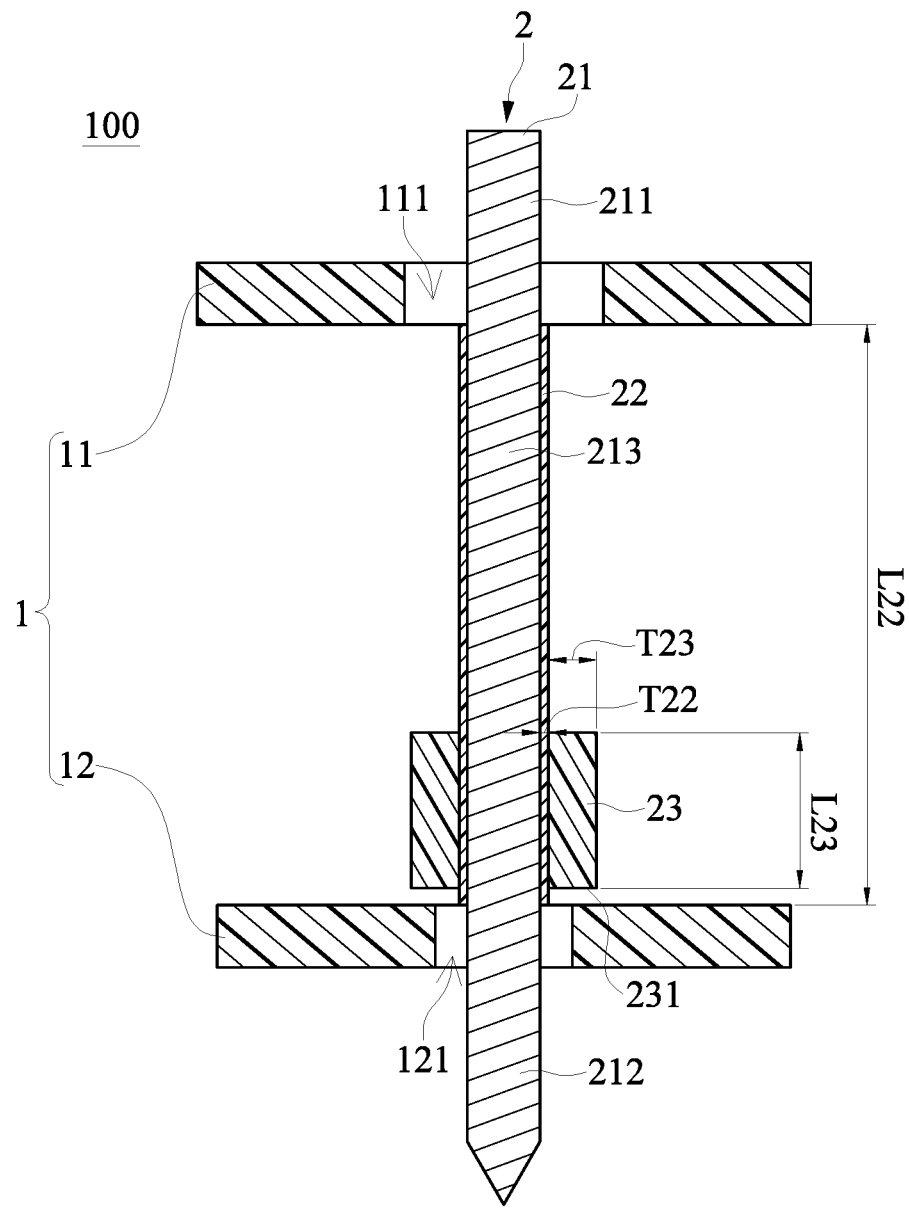
FIG. 3A is a cross-sectional view taken along a cross-sectional line IIIA-IIIA of FIG. 1.

As shown in FIG. 3A, the metallic pin 21 includes a connecting portion 211, a detecting portion 212, and a middle segment 213 arranged between the connecting portion 211 and the detecting portion 212. The connecting portion 211 is arranged adjacent to and outside of the corresponding first thru-hole 111, the detecting portion 212 passes through the corresponding second thru-hole 121, and the middle segment 213 is arranged between the upper die 11 and the lower die 12. Moreover, the connecting portion 211 contacts with the corresponding electrical pad of the space transformer (not shown), and the detecting portion 212 is used for testing an object to be tested, such as a semi-conductor wafer (not shown).

The insulating film 22 is formed on and covers entirely outer surfaces of the middle segment 213 (as shown in FIGS. 3A and 5), so that the middle segment 213 can be electrically isolated from other conductive components through the insulating film 22 for preventing any two adjacent rectangular probes 2 suffering from a short circuit.

Moreover, the insulating latch 23 is in a ring shape (as shown in FIG. 5) and is arranged around at least part of the insulating film 22 (e.g., the insulating latch 23 is arranged around outer surfaces of a lower portion of the insulating film 22 as shown in FIG. 3A). A length L23 of the insulating latch 23 is less than or equal to a length L22 of the insulating film 22. A thickness T23 of the insulating latch 23 is larger than a thickness T22 of the insulating film 22 and is at least 10 μm. The insulating latch 23 passes through the corresponding first thru-hole 111, and a bottom 231 of the insulating latch 23 is arranged adjacent to the detecting portion 212 and the corresponding second thru-hole 121.

Figure 6:
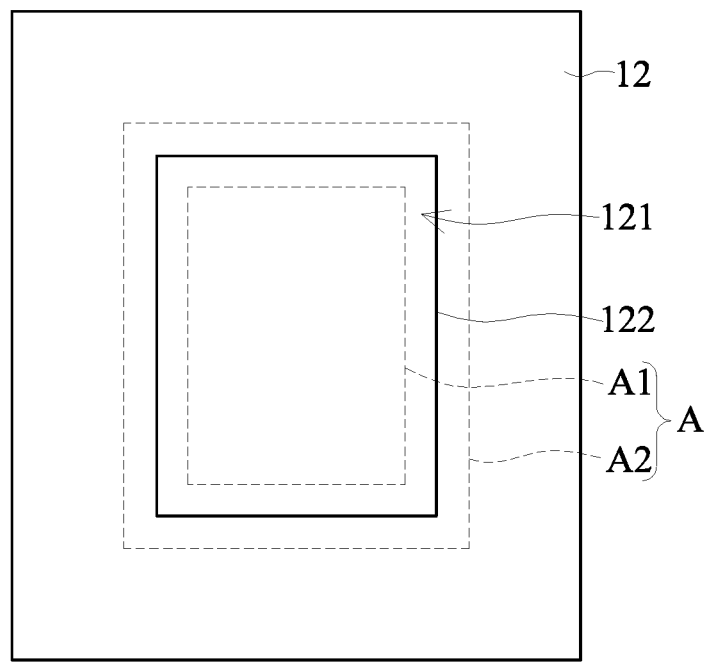
FIG. 6 is a schematic view showing a ring-shaped projected region defined by orthogonally projecting an insulating latch onto a lower die according to the present disclosure.
Figure 7:
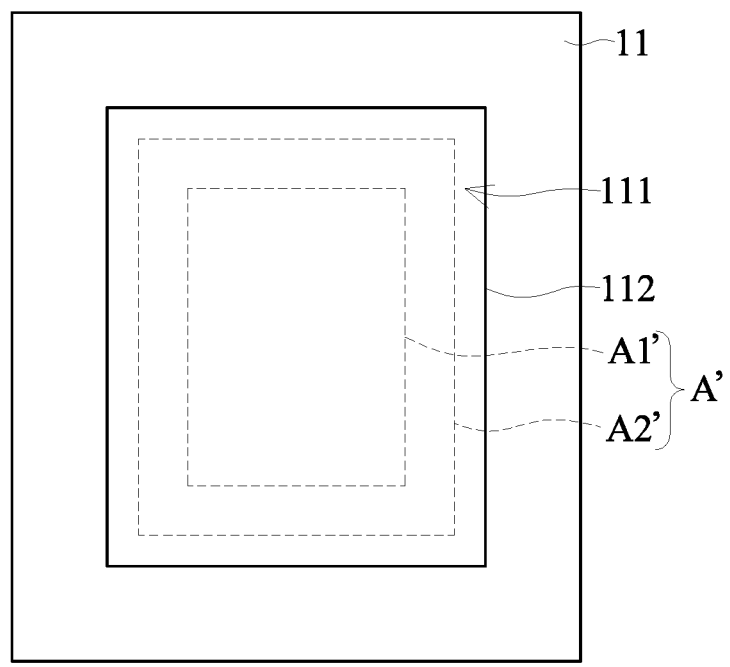
FIG. 7 is a schematic view showing a ring-shaped projected region defined by orthogonally projecting the insulating latch onto an upper die according to the present disclosure.

As shown in FIG. 6, when the insulating latch 23 is orthogonally projecting onto the lower die 12 to form a ring-shaped projected region A, an edge 122 of the corresponding second thru-hole 121 is arranged between an inner edge A1 and an outer edge A2 of the ring-shaped projected region A. In other words, as shown in FIG. 7, when the insulating latch 23 is orthogonally projecting onto the upper die 11 to form a ring-shaped projected region A', an inner edge A1' and an outer edge A2' of the ring-shaped projected region A' are arranged inside an edge 112 of the corresponding first thru-hole 111. It should be noted that the inner edge A1, A1' and the outer edge A2, A2' of the ring-shaped projected region A, A' in the present embodiment are defined by orthogonally projecting an inner edge and an outer edge of the insulating latch 23 onto the upper die 11 or the lower die 12.

Accordingly, each of the rectangular probes 2 of the probe card device 100 in the present embodiment is formed by using the insulating film 22 to cover entirely the outer surfaces of the middle segment 213 of the metallic pin 21 and using the insulating latch 23 to be formed around at least part of the insulating film 22, so that the structural strength of the metallic pin 21 can be effectively improved without affecting the electrically conductive property of the metallic pin 21.

Moreover, since the thickness T23 of the insulating latch 23 is larger than the thickness T22 of the insulating film 22 and is at least 10 μm, the insulating latch 23 can provide a better buffering performance to the metallic pin 21 so as to effectively mitigate collision and friction between the metallic pin 21 and the probe head 1, thereby increasing the reliability of the probe card device 100 (or the rectangular probe 2).

In addition, when the rectangular probe 2 is in an installing process (i.e., the rectangular probe 2 is inserted into the upper die 11 and the lower die 12), the bottom 231 of the insulating latch 23 of the rectangular probe 2 can abut against the lower die 12 and does not pass through the corresponding second thru-hole 121 by the structural design of the rectangular probe 2 (e.g., the edge 122 of the corresponding second thru-hole 121 is arranged between the inner edge A1 and the outer edge A2 of the ring-shaped projected region A as shown in FIG. 6). Therefore, the connection between the rectangular probe 2 and the probe head 1 can become more firm, and the friction between the rectangular probe 2 and the probe head 1 can be effectively reduced.

Figure 3B:
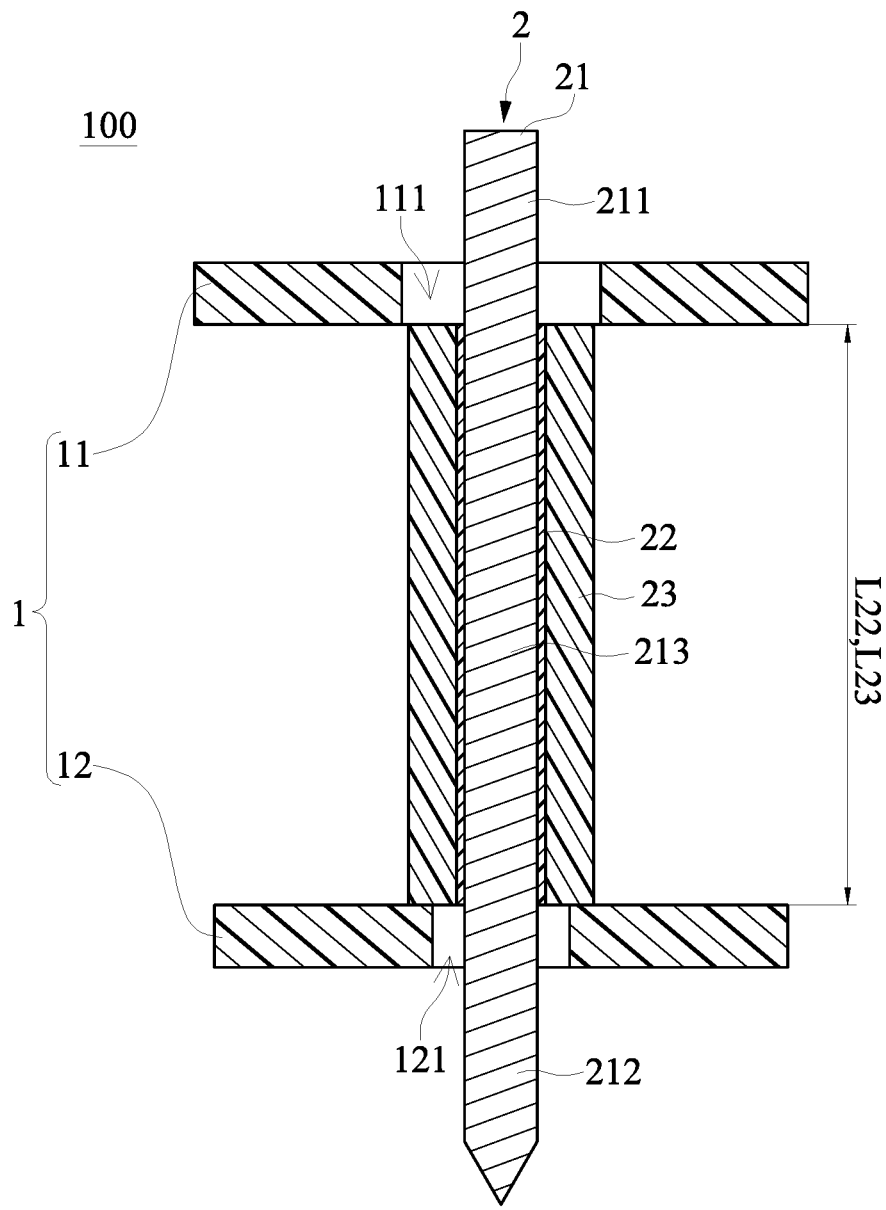
FIG. 3B is a cross-sectional view showing a first variation structure of FIG. 3A.
Figure 3C:
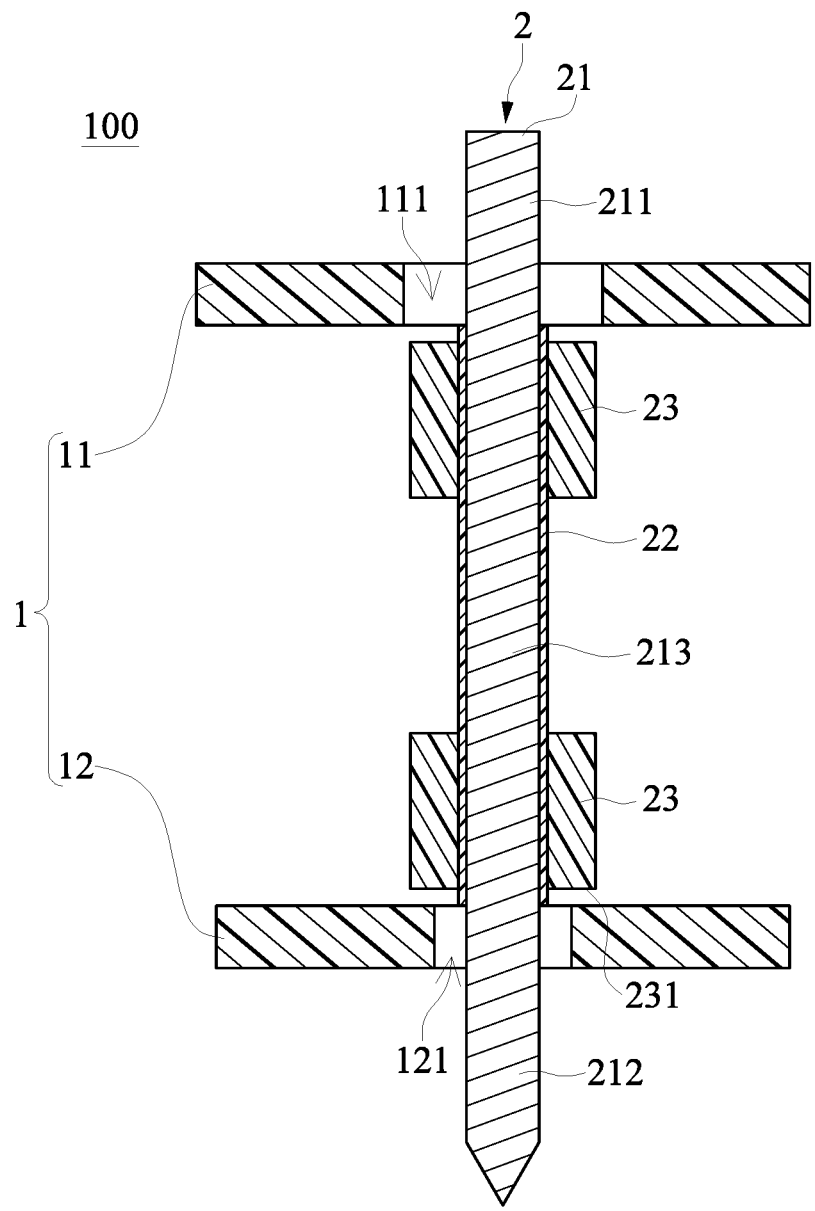
FIG. 3C is a cross-sectional view showing a second variation structure of FIG. 3A.

It should be noted that FIG. 3A shows the insulating latch 23 formed around at least part of the insulating film 22, but the present disclosure is not limited thereto. For example, as shown in FIG. 3B, the insulating latch 23 can be formed around the entire insulating film 22. Moreover, FIG. 3A shows that the length L 23 of the insulating latch 23 is less than the length L22 of the insulating film 22, but the present disclosure is not limited thereto. For example, as shown in FIG. 3B, the length L 23 of the insulating latch 23 can be equal to the length L22 of the insulating film 22. In other words, the length L 23 of the insulating latch 23 in the present disclosure is less than or equal to the length L22 of the insulating film 22. In addition, FIG. 3A shows the rectangular probe 2 provided with only one insulating latch 23 formed on the lower portion of the insulating film 22, but the present disclosure is not limited thereto. As shown in FIG. 3C, the rectangular probe 2 can be provided with at least two insulating latches 23 according to the design requirements.

As shown in FIG. 5, the middle segment 213 of the metallic pin 21 preferably includes two opposite broad side surfaces 214 and two opposite narrow side surfaces 215. The two broad side surfaces 214 are parallel to each other, and each of the two broad side surfaces 214 is in a planar shape. The two narrow side surfaces 215 are parallel to each other, and each of the two narrow side surfaces 215 is in a planar shape. In other words, there are no slots or protrusions formed on each of the side surfaces 214, 215 of the middle segment 213. Moreover, a minimum distance D1 between a portion of each of the two broad side surfaces 214 covered by the insulating latch 23 and an outer surface of the insulating latch 23 parallel to and adjacent to the portion of each of the two broad side surfaces 214 is equal to a minimum distance D1' between a portion of each of the two narrow side surfaces 215 covered by the insulating latch 23 and an outer surface of the insulating latch 23 parallel to and adjacent to the portion of each of the two narrow side surfaces 215, but the present disclosure is not limited thereto.

Specifically, a cross section of the insulating film 22 and a cross section of the insulating latch 23 each have a rectangular ring-shape. The insulating film 22 includes a plurality of outer side surfaces 221, and minimum distances D2 respectively from parts of the outer side surfaces 221 of the insulating film 22 covered by the insulating latch 23 to the outer surfaces of the insulating latch 23 are equal to each other.

Accordingly, in each of the rectangular probes 2 of the probe card device 100 of the present embodiment, each of the two broad side surfaces 214 and the two narrow side surfaces 215 is in a planar shape, the minimum distance D1 of each of the two broad side surfaces 214 with respect to the adjacent outer surface of the insulating latch 23 is equal to the minimum distance D1' of each of the two narrow side surfaces 215 with respect to the adjacent outer surface of the insulating latch 23, and the minimum distances D2 between the outer surfaces 221 of the insulating film 22 and the outer surfaces of the insulating latch 23 are the same, so that when the rectangular probe 2 receives a pressure force in a detecting process, the pressure force can be uniformly dispersed to the insulating film 22 and the insulating latch 23 for increasing the reliability and the serve life of the rectangular probe 2.

Figure 4:
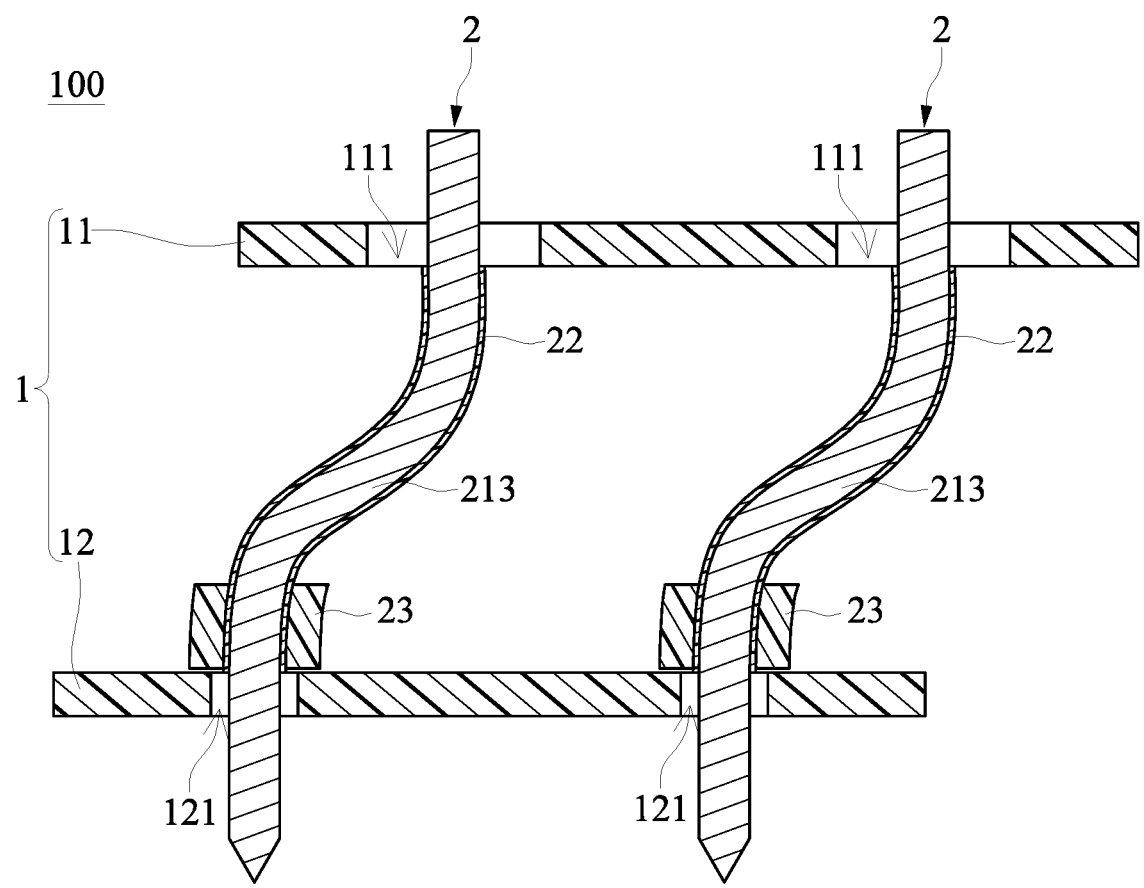
FIG. 4 is a cross-sectional view of the probe card device according to the present disclosure in which a middle segment of each probe is in a curved shape.

In addition, FIG. 3A shows that the first thru-holes 111 of the upper die 11 are respectively aligned with the second thru-holes 121 of the lower die 12, but the present disclosure is not limited thereto. For example, as shown in FIG. 4, the first thru-holes 111 of the upper die 11 and the second thru-holes 121 of the lower die 12 are in a staggered arrangement, and the middle segment 213 and the insulating film 22 of each of the rectangular probes 2 are in a curved shape. In any two adjacent rectangular probes 2, the two insulating latches 23 are spaced apart from each other for preventing any two adjacent rectangular probes 2 suffering from collision or a short circuit.

The Effects of the Present Disclosure

In summary, because of the structural design and arrangement of the metallic pin 21, the insulating film 22, and the insulating latch 23 of the rectangular probe 2 (or the probe card device 100) provided by the present embodiment, the structural strength of the metallic pin 21 can be effectively improved without affecting the electrically conductive property of the metallic pin 21, the metallic pin 21 is capable of providing a better buffering performance so as to effectively mitigate collision and friction between the metallic pin 21 and the probe head 1 (e.g., the upper die 11 and the lower die 12), and the connection between the rectangular probe 2 and the probe head 1 can become more firm.

In addition, when the rectangular probe 2 is in an installing process, the bottom 231 of the insulating latch 23 of the rectangular probe 2 can abut against the lower die 12 and does not pass through the corresponding second thru-hole 121 by the structural design of the rectangular probe 2 (e.g., the edge 122 of the corresponding second thru-hole 121 is arranged between the inner edge A1 and the outer edge A2 of the ring-shaped projected region A).

Moreover, in each of the rectangular probes 2 of the probe card device 100 of the present embodiment, each of the two broad side surfaces 214 and the two narrow side surfaces 215 is in a planar shape, the minimum distance D1 of each of the two broad side surfaces 214 with respect to the adjacent outer surface of the insulating latch 23 is equal to the minimum distance D1' of each of the two narrow side surfaces 215 with respect to the adjacent outer surface of the insulating latch 23, and the minimum distances D2 between the outer surfaces 221 of the insulating film 22 and the outer surfaces of the insulating latch 23 are the same, so that when the rectangular probe 2 receives a pressure force in a detecting process, the pressure force can be uniformly dispersed to the insulating film 22 and the insulating latch 23 for increasing the reliability and the serve life of the rectangular probe 2.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A probe card device, comprising:
    an upper die having a plurality of first thru-holes, wherein each of the first thru-holes has a first aperture;
    a lower die having a plurality of second thru-holes, wherein the second thru-holes respectively correspond in position to the first thru-holes, and each of the second thru-holes has a second aperture smaller than the first aperture; and
    a plurality of rectangular probes each having a first end and a second end opposite to the first end, wherein the first ends of the rectangular probes are respectively arranged adjacent to and outside of the first thru-holes, and the second ends of the rectangular probes respectively pass through the second thru-holes, wherein each of the rectangular probes includes:
        a metallic pin including a connecting portion, a detecting portion, and a bendable middle segment arranged between the connecting portion and the detecting portion, wherein the connecting portion is arranged adjacent to and outside of the corresponding first thru-hole, the detecting portion passes through the corresponding second thru-hole, and the middle segment is arranged between the upper die and the lower die;
        an insulating film covering entirely outer surfaces of the middle segment; and
        two insulating latches separated from and spaced apart from each other, wherein each of the two insulating latches is in a ring shape, the two insulating latches are respectively connected to and arranged around two parts of the insulating film, and the insulating film and the two insulating latches are made of the same insulative material, wherein a length of each of the two insulating latches is less than that of the insulating film, and a thickness of each of the two insulating latches is larger than that of the insulating film and is at least 10 μm; the two insulating latches are arranged between the upper die and the lower die, one of the two insulating latches is arranged adjacent to the detecting portion and the corresponding second thru-hole, and the other one of the two insulating latches is arranged adjacent to the connecting portion and the corresponding first thru-hole, and wherein when any one of the two insulating latches is orthogonally projecting onto the lower die to form a ring-shaped projected region, an edge of the corresponding second thru-hole is arranged between an inner edge and an outer edge of the ring-shaped projected region.

2. The probe card device as claimed in claim 1, wherein in each of the rectangular probes, the middle segment includes two broad side surfaces and two narrow side surfaces, the two broad side surfaces are parallel to each other, each of the two broad side surfaces is in a planar shape, the two narrow side surfaces are parallel to each other, and each of the two narrow side surfaces is in a planar shape.

3. The probe card device as claimed in claim 1, wherein in each of the rectangular probes, the middle segment includes two opposite broad side surfaces and two opposite narrow side surfaces, and wherein in the middle segment and any one of the two insulating latches of each of the rectangular probes, a minimum distance between a portion of each of the two broad side surfaces covered by the insulating latch and an adjacent outer surface of the insulating latch is equal to a minimum distance between a portion of each of the two narrow side surfaces covered by the insulating latch and an adjacent outer surface of the insulating latch.

4. The probe card device as claimed in claim 1, wherein in each of the rectangular probes, a cross section of the insulating film having have a rectangular ring-shape and a cross section of any one of the two insulating latches having a rectangular ring-shape, the insulating film includes a plurality of outer side surfaces, and minimum distances respectively from parts of the outer side surfaces of the insulating film covered by the insulating latch to outer surfaces of the insulating latch are equal to each other.

5. The probe card device as claimed in claim 1, wherein the first thru-holes of the upper die and the second thru-holes of the lower die are in a staggered arrangement, and the middle segment and the insulating film of each of the rectangular probes are in a curved shape; in any two adjacent rectangular probes, the insulating latches are spaced apart from each other.

6. The probe card device as claimed in claim 1, wherein in each of the rectangular probes, one of the two insulating latches abuts against the lower die, and the insulating film and the two insulating latches are integrally formed as a one-piece structure.

7. A rectangular probe, comprising:
    a metallic pin including a connecting portion, a detecting portion, and a bendable middle segment arranged between the connecting portion and the detecting portion;
    an insulating film covering entirely outer surfaces of the middle segment; and
    two insulating latches separated from and spaced apart from each other, wherein each of the two insulating latches is in a ring shape, the two insulating latches are respectively connected to and arranged around two parts of the insulating film, and the insulating film and the two insulating latches are made of the same insulative material, wherein one of the two insulating latches is arranged adjacent to the detecting portion, and the other one of the two insulating latches is arranged adjacent to the connecting portion, and wherein a length of each of the two insulating latches is less than that of the insulating film, and a thickness of each of the two insulating latches is larger than that of the insulating film and is at least 10 μm.

8. The rectangular probe as claimed in claim 7, wherein the middle segment includes two broad side surfaces and two narrow side surfaces, the two broad side surfaces are parallel to each other and each is in a planar shape, and the two narrow side surfaces are parallel to each other and each is in a planar shape, and wherein in the middle segment and any one of the two insulating latches, a minimum distance between a portion of each of the two broad side surfaces covered by the insulating latch and an adjacent outer surface of the insulating latch is equal to a minimum distance between a portion of each of the two narrow side surfaces covered by the insulating latch and an adjacent outer surface of the insulating latch.

9. The rectangular probe as claimed in claim 7, wherein the insulating film and the two insulating latches are integrally formed as a one-piece structure.

\* \* \* \* \*